(12) United States Patent
Strahm et al.

(10) Patent No.: US 8,294,561 B2
(45) Date of Patent: Oct. 23, 2012

(54) DASHBOARD INDICATOR MODULE FORMED BY A MOTOR AND ELECTRICAL CONNECTION MEANS

(75) Inventors: Martin Strahm, Boudry (CH); Michael Geiser, Tavannes (CH); Pierre Gandel, Montfaucon (FR); Guillaume Loussert, Besancon (FR)

(73) Assignee: Sonceboz Automative SA, Sonceboz (CH)

( * ) Notice: Subject to any disclaimer, the term of this patent is extended or adjusted under 35 U.S.C. 154(b) by 279 days.

(21) Appl. No.: 12/598,890

(22) PCT Filed: May 7, 2008

(86) PCT No.: PCT/FR2008/000646
§ 371 (c)(1),
(2), (4) Date: Feb. 22, 2010

(87) PCT Pub. No.: WO2008/152240
PCT Pub. Date: Dec. 18, 2008

(65) Prior Publication Data
US 2011/0043345 A1 Feb. 24, 2011

(30) Foreign Application Priority Data

May 9, 2007 (FR) .................................. 07 54937
Oct. 3, 2007 (FR) .................................. 07 06930

(51) Int. Cl.
*B60Q 1/00* (2006.01)
(52) U.S. Cl. .................. 340/438; 340/815.78; 116/286; 116/288
(58) Field of Classification Search .................. 340/438, 340/439, 815.78, 815.42, 815.47, 441, 461, 340/525, 815.45, 815.79, 815.8, 815.68, 340/459, 462, 466; 116/286–288, 300, 308, 116/328, 332, DIG. 5, DIG. 6, DIG. 36; 362/23, 362/26, 27, 29–31
See application file for complete search history.

(56) References Cited

U.S. PATENT DOCUMENTS

| 4,247,981 | A | * | 2/1981 | Walters .......................... 29/845 |
| 5,446,326 | A | | 8/1995 | Scheider |
| 5,825,338 | A | * | 10/1998 | Salmon et al. .................... 345/7 |
| 6,025,820 | A | * | 2/2000 | Salmon et al. ............... 345/75.1 |
| 6,974,220 | B2 | * | 12/2005 | Birman et al. .................. 362/26 |
| 7,876,235 | B2 | * | 1/2011 | Fournier et al. .......... 340/815.45 |

FOREIGN PATENT DOCUMENTS

| EP | 1 164 052 A | 12/2001 |
| FR | 2 744 680 A | 8/1997 |
| FR | 2 782 596 A | 2/2000 |
| FR | 2 885 739 A | 11/2006 |
| GB | 1 076 490 A | 7/1967 |
| GB | 2 221 098 A | 1/1990 |
| JP | 10 032040 A | 2/1998 |

* cited by examiner

*Primary Examiner* — Anh V La
(74) *Attorney, Agent, or Firm* — Arent Fox LLP

(57) ABSTRACT

The present invention relates to a dashboard indicator module comprising, in a casing, a rotary motor, an output shaft, mechanical reduction device associated with the motor, at least one electrical supply coil, electrical connection tabs linked to the coils leaving the casing and electrical contact elements, characterized in that the electrical contact elements can be fitted on the connection tabs in order to produce solderless connectors on the printed circuit or even removed from the connection tabs in order to allow the connection tabs of the motor to be soldered directly to the printed circuit.

8 Claims, 10 Drawing Sheets

DASHBOARD INDICATOR MODULE FORMED BY A MOTOR AND ELECTRICAL CONNECTION MEANS

CROSS-REFERENCE TO RELATED APPLICATION

This application is a National Stage entry of International Application No. PCT/FR2008/000646, filed May 7, 2008, which claims priority to French application Ser. No. 07/54937 filed May 9, 2007 and French application Ser. No. 07/06930 filed Oct. 3, 2007, the disclosure of the prior applications, specification, claims, and drawings of which are incorporated herewith by reference.

BACKGROUND

1. Field

The present invention relates to the field of motor vehicle dashboard indicators and more particularly relates to a module consisting of a motor and electrical connection means—so-called connectors or contacts—intended to be fixed on a printed circuit that includes all the electronic components required for the operation of the motor.

2. Background

Generally, dashboard pointers (tachometer, gauge) for motor vehicles are actuated by so-called step by step electromagnetic motors. Such motors are for example disclosed in patent FR 2742940 or patent FR 2859323. Such motors are fixed behind the dashboard on a printed circuit on which the electrical supply tracks and all the electronic components intended to operate the motor are fixed. The printed circuit is fixed in the dashboard instrument and the motor is fixed to the printed circuit. The electric connection of the motor is generally carried out through the soldering of electric connection tabs integral with the motor together with the printed circuit tracks. Soldering the connectors to the printed circuit and positioning the motor connection tabs in such connectors can also be considered. Patent FR 2885739 of the applicant discloses a method of this type.

Nevertheless, all the prior art methods have some disadvantages. First, both the connectors and the casing containing the motor must be positioned on the printed circuit. Thus, the connectors must be positioned on the printed circuit and then the casing must be positioned on the printed circuit with the casing connected to the connectors. In addition, prior art techniques do not allow the easy removal and reutilization of the motor on another printed circuit with the same electric connection means in a simple and efficient way.

Solutions already exist in the prior art showing motors with deformable connection tabs. Upon the positioning of the motor on the printed circuit, such particular connection tabs come in contact with electric contact surface areas on the printed surface and thus are deformed in order to provide the electric contact. Thus, the motor is not soldered onto the circuit.

However, such solutions require a modification to the original motor solution that contains very special connection tabs. This modification requires a different product in parallel with the original apparatus having straight connection tabs affixed to the motor and requiring solders on the printed circuit. Depending on the application or the targeted client, the production tools are doubled with this modification and manufacturing the assembly of two motors is expensive.

SUMMARY

The invention of the present disclosure intends to remedy this problem with the described electric motor module that can be used with connection tabs being soldered on the printed circuit or with solderless connectors using contacts added onto the connection tabs, depending on the type of connection requested by a client.

More particularly, one object of the present invention is to provide a dashboard indicator module including, in a casing, a rotary motor, an output shaft, mechanical reduction means associated with the motor, at least one electric supply coil, and electric connection tabs associated with the coils leaving said casing and electric contact elements, where the contact elements can be fitted on the connection tabs in order to provide solderless connections to the printed circuits or can be removed from the connection tabs in order to allow the connection tabs of the motor to be directly soldered to the printed circuit.

Another object of the invention is to provide electrical contact elements composed of a first part in mechanical and electrical connection with said tabs and a second free part intended to come in mechanical and electrical contact with a voltage-supplied surface of a printed circuit that supports said module and is used for supplying said motor with voltage.

Another object of the present invention consists in providing is to provide a module including a motor and electric contacts integral with the motor that does not require soldering the motor to a printed circuit—or any soldering at the printed circuit level. This provides for easy removal of the motor positioned on the printed circuit.

Another object of the present invention is to provide a module including a motor, electrical contacts, and mechanical rivets that are independent of the printed circuit and that can adapt to different types of printed circuits.

Thus, the printed circuit intended to receive the indicated module described herein provides electrical or mechanical fastening means, the electrical components required for steering the motor, and holes to enable the passage of the electrical and mechanical contacts of the module.

In addition, the motor provides electrical connection tabs in the form of axes or pins and electrical contacts that are mechanically fixed or countersunk on such tabs. Soldering the electrical contacts with the tabs can also be considered.

The shape of the electrical contacts can be any shape (e.g. a spiral shape), and may include a first part ensuring the electric contact of an element with the motor connection tab and a second part oriented toward the printed circuit to link the electrical connection area of the printed circuit to the motor connection tab. The shape of this contact must also allow for the deformation thereof upon the positioning of the motor on the printed circuit.

The mechanical retention of the motor on the printed circuit can be provided by deformable rivets or by any other method known by those of ordinary skill in the art.

Further, upon the mechanical fastening of the motor, the electrical contact elements may deform and thus act as a spring. When in this compressed position, a force is applied onto the printed circuit and onto the motor casing. Because the rivets may provide for mechanical retention of the motor on the printed circuit, this force applied by the spring may provide reliable electric contact.

Thus, described herein is a motor module and a reliable and independent electrical contact that can adapt to various printed contacts and can be positioned on and/or removed from the printed circuit at any time.

In a non-limiting aspect, the motor can provide cavities close to the electrical connection tabs that allow the positioning of the lower face of the motor casing onto the printed circuit. The module can also include pads on which the motor may rest. With either solution, the motor may be fixed in a stable way to the printed circuit and may be unaffected by possible vibrations during motor operation.

DESCRIPTION OF THE DRAWINGS

Understanding the invention may be aided by reference to the appended drawings, in which.

DETAILED DESCRIPTION

Figure 1:
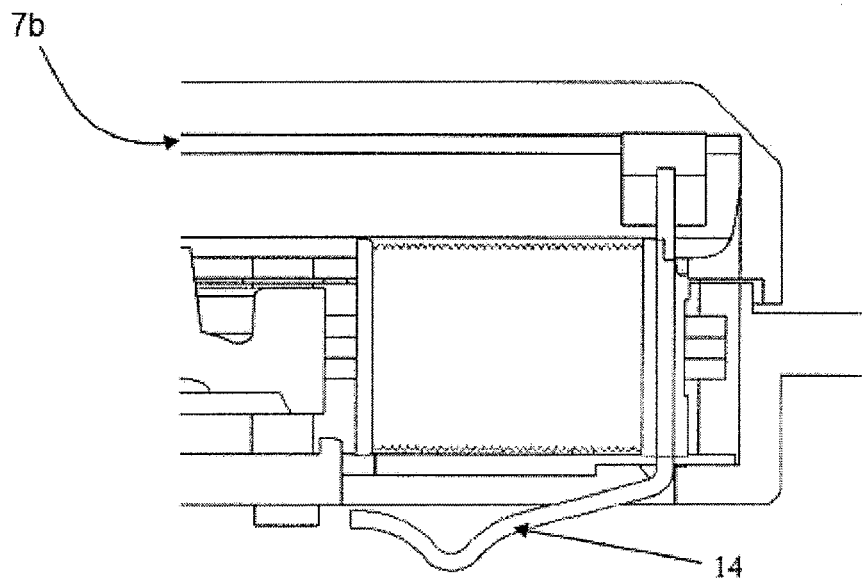
FIG. 1 shows a cross-sectional view of a prior art module.

FIG. 1 shows a prior art embodiment that includes a motor (e.g. an electromagnetic motor) in a casing 7b and electrical connection tabs 14 associated with the motor coils, having a nonlinear J-shape. This motor is intended to be fixed on a printed circuit and connection tabs 14 are intended to be deformable to provide electrical contact with the printed circuit. However, this embodiment requires apparatuses that are much different from those disclosed herein. Specifically, the prior art provides apparatuses that include straight connection tabs that must either be soldered or nonlinear tabs that are not soldered. Thus, according to the prior art, these two solutions must be produced and utilized independently.

Figure 2:
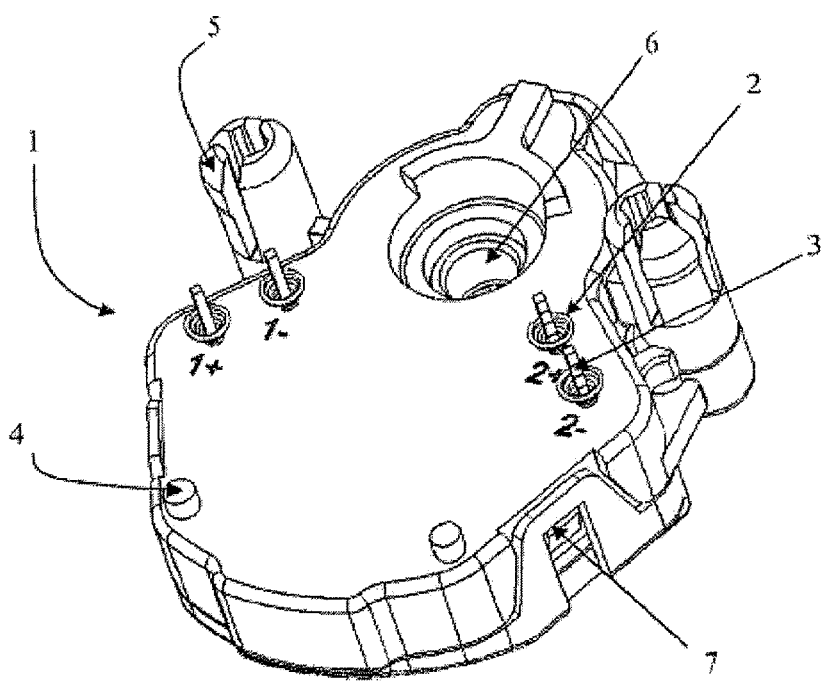
FIG. 2 shows an exemplary module according to the invention, formed of a motor in its casing and electrical contacts associated with the motor connection tabs.
Figure 3:
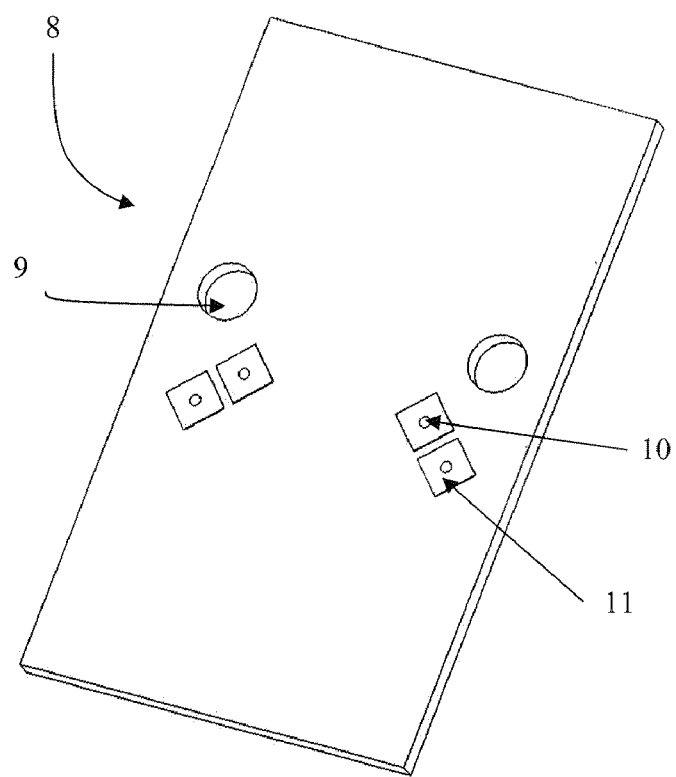
FIG. 3 shows a printed circuit intended to receive the module shown in FIG. 2.

FIG. 2 shows a module 1 according to the present disclosure. It is composed of a clamped plastic casing 7 containing an electromagnetic motor, and a set of reducer gears moving in rotation on an axis 6, and a hollow axis intended to receive a pointer. Such pointer may be used for providing, on the dashboard of a motor vehicle, information regarding the motor vehicle's speed level or regarding any other parameter. This casing 7 may include two deformable rivets 5 which are used for the mechanical behavior of the casing 7 on the printed circuit 8 intended to receive it. It also includes resting pads 4 on which the module 1 may rest and straight electrical connection tabs 3. Such connection tabs 3 are the electrical connections of the motor coils inside the casing 7. In addition, two pairs of tabs 3 may be utilized for a two-coil, two phase motor. Electrical contacts may be mechanically countersunk or soldered on such tabs. Furthermore, module 1 be positioned on a printed circuit 8 (FIG. 3). Additionally, where the contacts 2 of the tabs 3 are removed, module 1 can be connected to the printed circuit 8 by directly soldering the tabs 3 to the printed circuit 8.

As FIG. 3 illustrates, in addition to the electronic elements required for driving the motor, printed circuit 8 may contain a first series of holes 9 intended to receive the deformable mechanical rivets 5 (FIG. 2). Once such rivets 5 are positioned through the holes 9, they may become deformed to provide solid retention of the module 1 on the printed circuit 8. This circuit 8 also shows a second series of holes 10 intended to receive the electrical connection tabs 3, which may pass through the holes 10 without any physical contact. Contact surface areas 11, which receive the contacts 2 of the module 1, may be positioned close to such holes 10. When positioning the module 1 on the printed circuit 8, the rivets 5 provide the mechanical retention, the resting plots 4 provide the stability, and the deformable contacts 2 provide the electrical contact between the connection tabs 3 and the contact surface area 11 through a spring effect. Without the contacts 2, the tabs 3 of the module 1 may be directly soldered on the contact surface areas 11.

Figure 4:
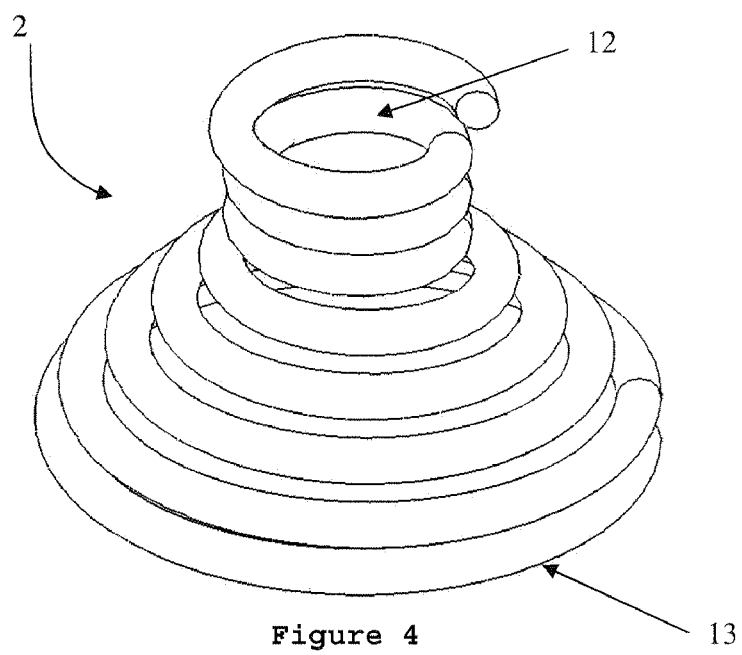
FIG. 4 shows an exemplary electrical contact used in the module of the invention in a non-deformed condition.

FIG. 4 illustrates a first embodiment of a contact element 2 in an uncompressed and non-deformed condition. In this first embodiment, the contact 2 takes the shape of a conical and helicoidal spring and includes two significant parts. The first part 12 is intended to the connection tab 3, either through mechanical countersinking or soldering. The second part 13 is intended to provide electrical contact with the contact surface area 11 of the printed circuit 8.

During the positioning of the module 1 on the printed circuit 8, this contact element 2 becomes deformed and thus provides reliable electrical contact between the printed circuit 8 and the motor of the module 2 through spring forces exerted by the deformed or compressed contact element.

Figure 5:
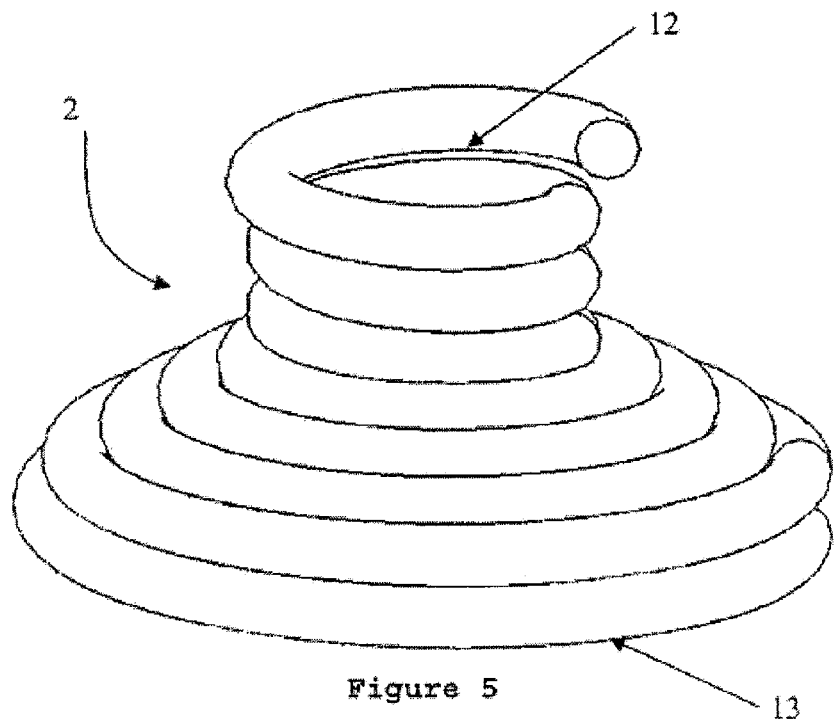
FIG. 5 shows an exemplary electrical contact used in the module of the invention according to FIG. 3 in a deformed condition.

FIG. 5 shows the contact element 2 according to FIG. 4 but in a deformed condition after placing module 2 on the printed circuit 8. In such a deformed condition, second part 13 may be in contact with the contact surface area 11 of the printed circuit 8 and the windings of the contact 2 may be closer to each other, such as in a joint winding configuration.

Figure 6:
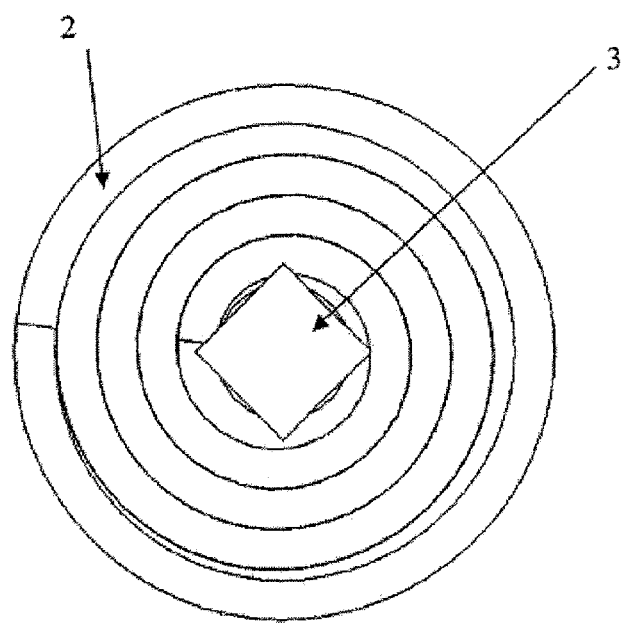
FIG. 6 shows a top view of the module where the contact shown in FIGS. 4 and 5 is fixed on an electrical connection tab of the motor.

In addition, when the contact 2 is provided on the connection tab 3, these elements may be arranged under the module as shown in FIG. 6. In this exemplary arrangement, connection tab 3 may be in physical contact with the contact element 2 at the level of the first part 12 previously described.

Figure 7:
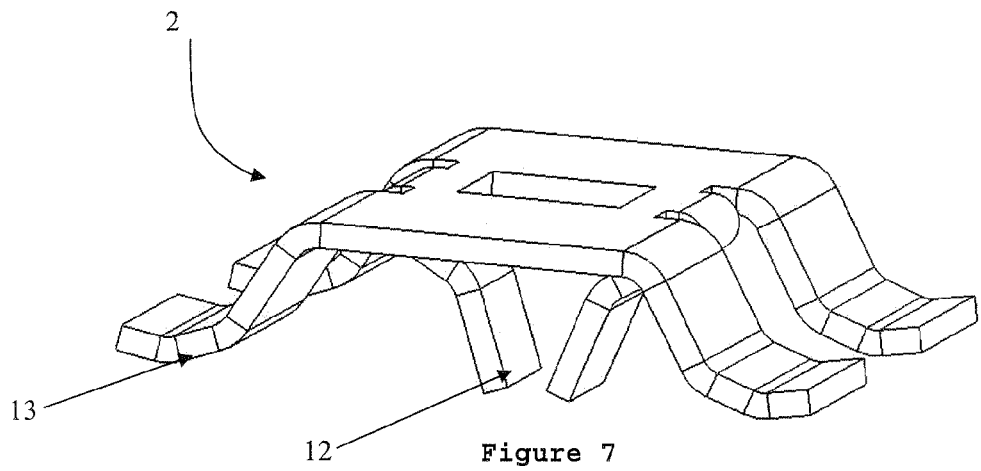
FIG. 7 shows another exemplary electrical contact used in the module of the invention in a non-deformed condition.
Figure 8:
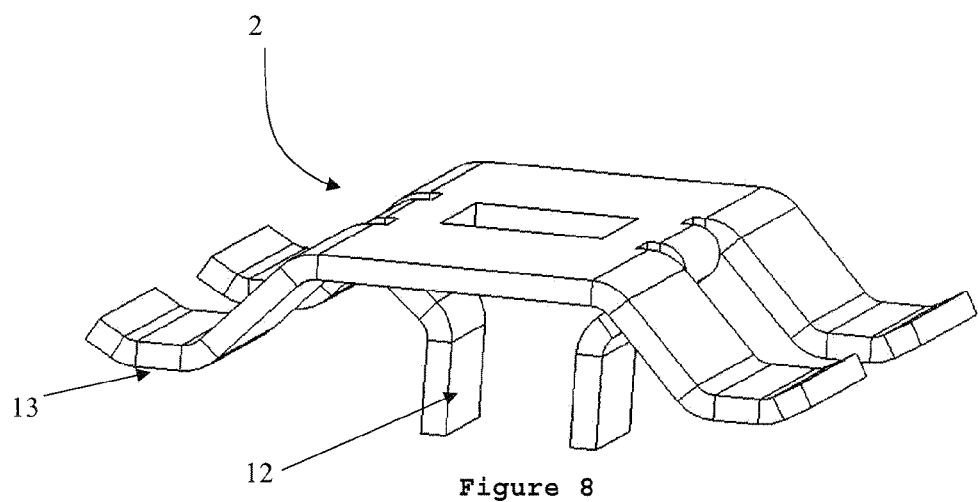
FIG. 8 shows another exemplary electrical contact used in the module of the invention according to FIG. 7 in a deformed condition.

FIG. 7 shows a contact element 2 in a second embodiment that displays elastic properties and includes two distinct parts 12 and 13 intended to come into contact with the connection tab 3 of the motor and with the electrical contact surface area 11 of the printed circuit 8, respectively. In FIG. 7, the contact element 2 may be in a non-deformed condition. FIG. 8 shows a contact element 2 in a deformed condition, such as after assembling the module on the printed circuit 8.

Figure 9:
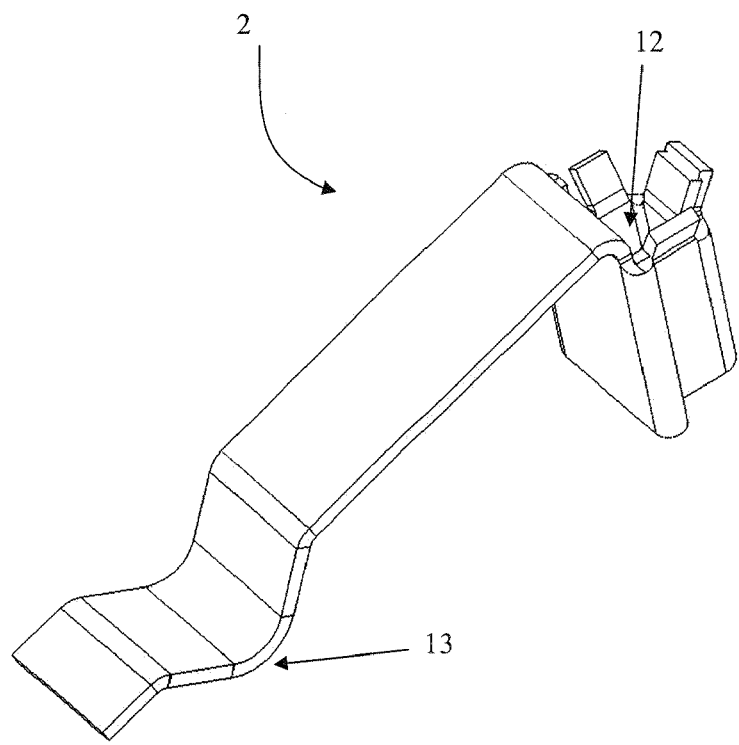
FIG. 9 shows another exemplary electrical contact used in the module of the invention.

FIG. 9 shows a contact element 2 in a third embodiment with two characteristic parts 12 and 13. In addition, FIGS. 10 and 15 show cross-sectional views of the module close to, or in contact with, the printed circuit.

Figure 10:
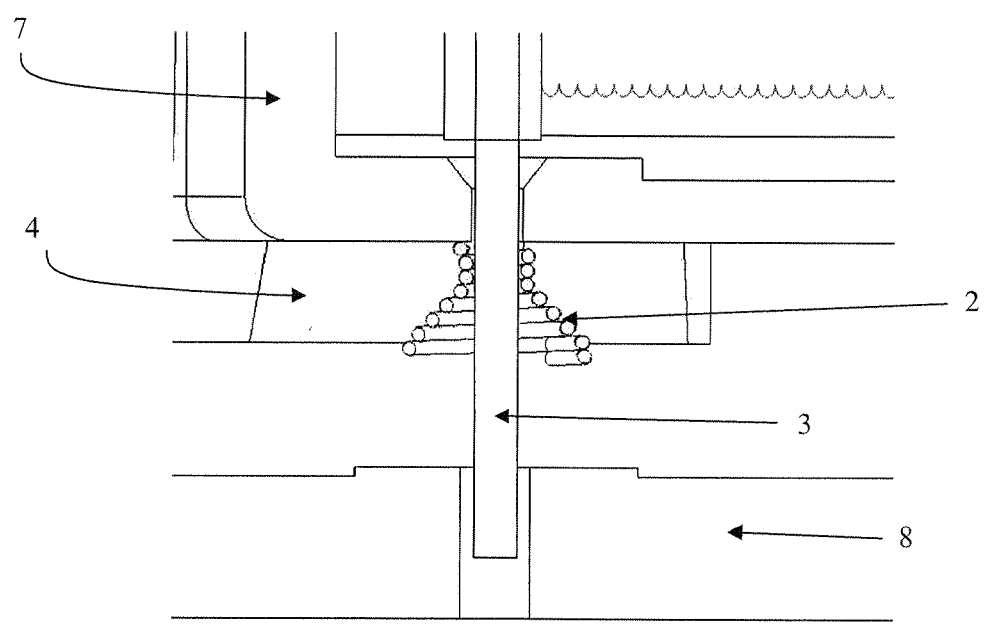
FIG. 10 is a cross-sectional view of a module according to the invention including contacts as shown in FIGS. 4, 5 and 6 close to a printed circuit.
Figure 12:
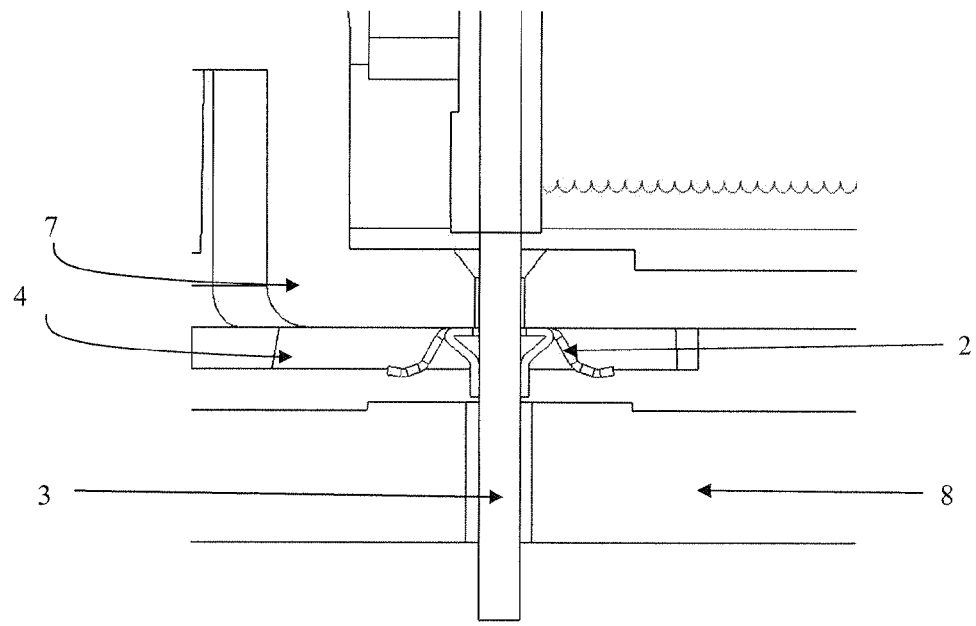
FIG. 12 is a cross-sectional view of a module according to the invention including contacts as shown in FIGS. 7 and 8, close to a printed circuit.
Figure 14:
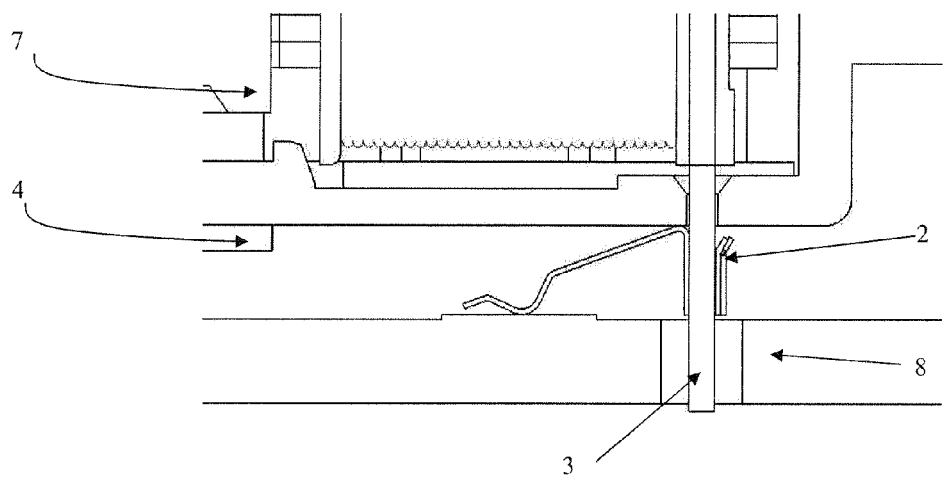
FIG. 14 is a cross-sectional view of a module according to the invention including contacts as shown in FIG. 9 close to a printed circuit.

In FIGS. 10, 12 and 14, the module is close to the printed circuit 8 prior to being fitted thereto. The contact 2 is positioned to be integral with the connection tab 3, which may begin protruding through the hole 10 of the printed circuit 8.

Figure 11:
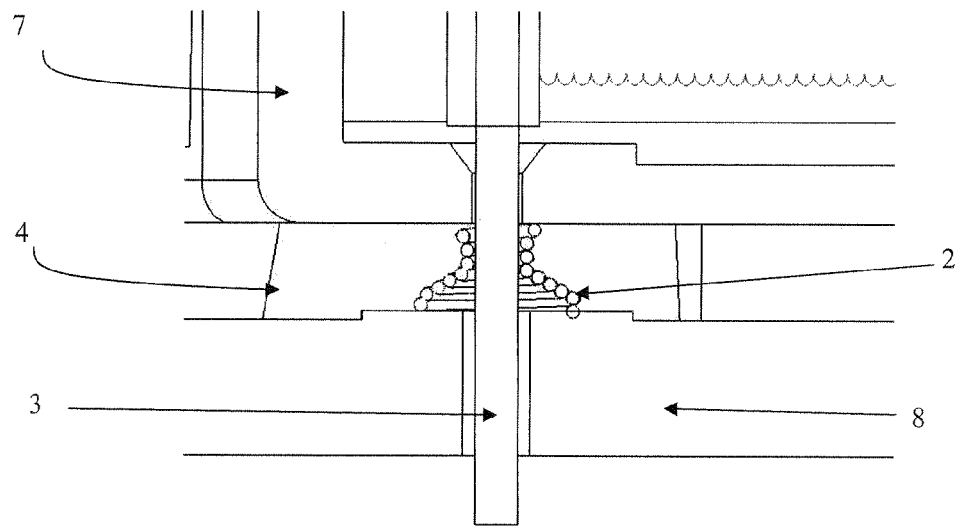
FIG. 11 is a cross-sectional view of a module according to the invention including contacts as shown in FIGS. 4, 5 and 6 in contact with a printed circuit.
Figure 13:
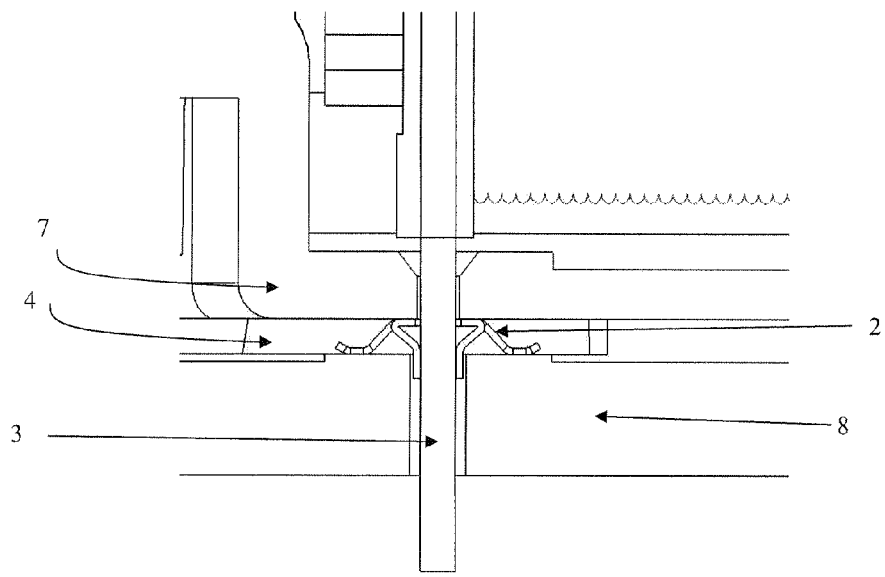
FIG. 13 is a cross-sectional view of a module according to the invention including contacts as shown in FIGS. 7 and 8 in contact with a printed circuit.
Figure 15:
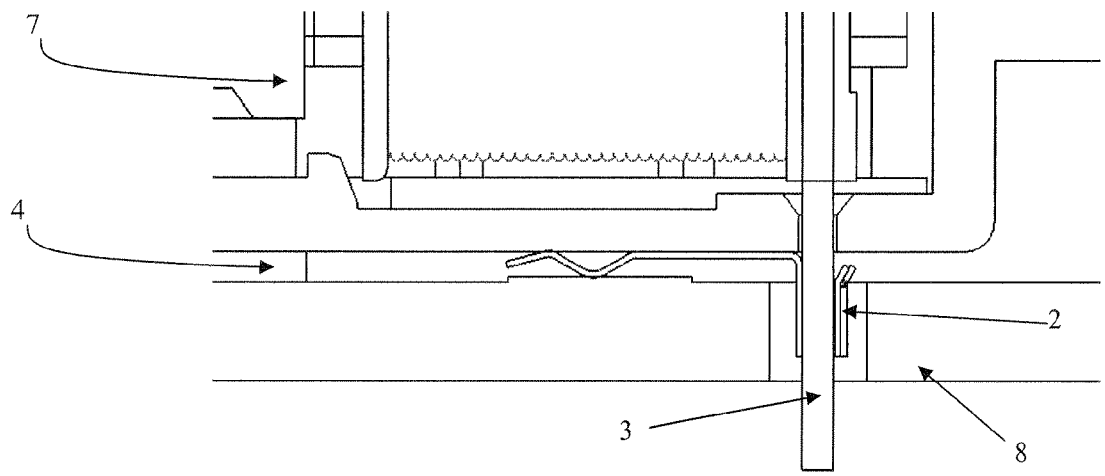
FIG. 15 is a cross-sectional view of a module according to the invention including contacts as shown in FIG. 9 in contact with a printed circuit.

In FIGS. 11, 13 and 15, the module is fitted on the printed circuit 8. The rest pads 4 may be in contact with the printed circuit 8 and the contact elements 2 may be in a deformed condition, providing electrical power to the motor through contact elements 2. Furthermore, when removing the contacts 2 from the tabs 3, the tabs 3 may be directly soldered to the printed circuit 8.

Figure 16:
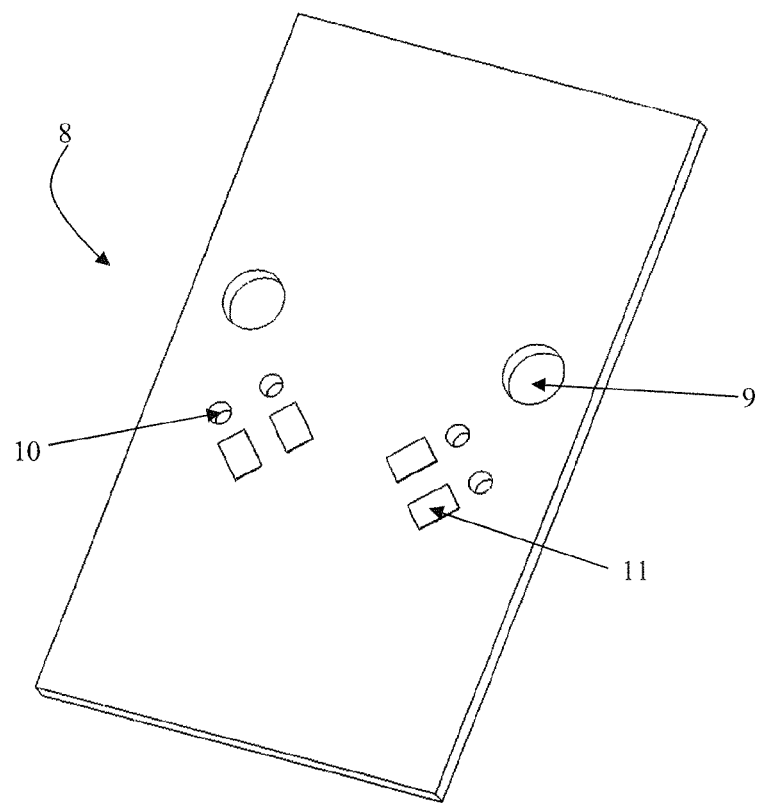
FIG. 16 is a printed circuit intended to receive a module according to the invention including contacts as shown in FIG. 9.

FIG. 16 shows the printed circuit 8 intended to receive the contact element 2 in the third embodiment shown in FIGS. 9, 14 and 15.

In addition, the elements of the printed circuit of FIG. 3 can receive the contact elements in the first and second embodiments. The relative position of the holes 10 for the passage of the tabs 3 and complex surface areas 11 is one difference between the printed circuits of FIGS. 3 and 16. On the printed circuit of FIG. 3, the holes 10 are in the middle of the contact surface area 11 in relation to the configuration of the contact elements 2 in the first and second embodiments, whereas the printed circuit 8 of FIG. 16 shows holes 10 which are at the side of the contact surface area 11 in the third embodiment.

Figures 17A, 17B:
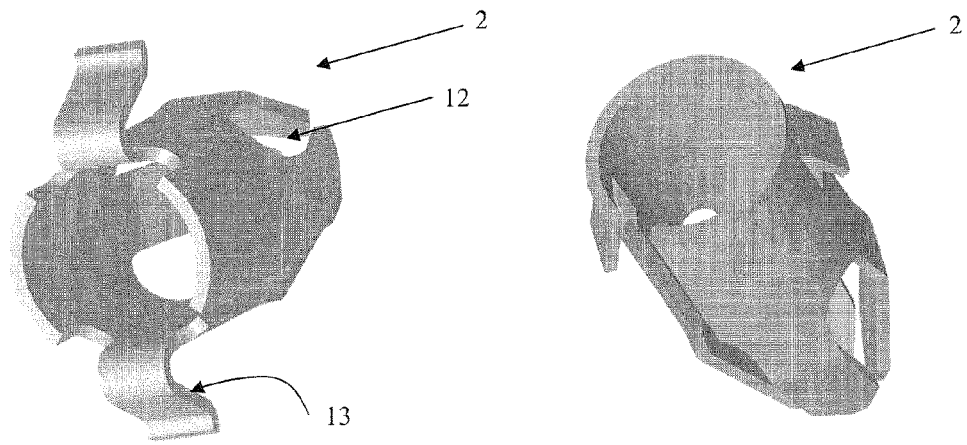
FIGS. 17a and 17b show another exemplary electrical contact used in the module of the invention.

FIGS. 17a and 17b show another example of an electric contact 2 in a tubular form for easy soldering on the printed circuit 8. A first part 12 is intended to come in contact with the connection tab 3 through a spring effect. A second part 13 provides the electronic contact with the printed circuit 8 in the form of wings, the number of such wings varying and having various forms as can be seen in FIGS. 17a and 17b.

Figure 18:
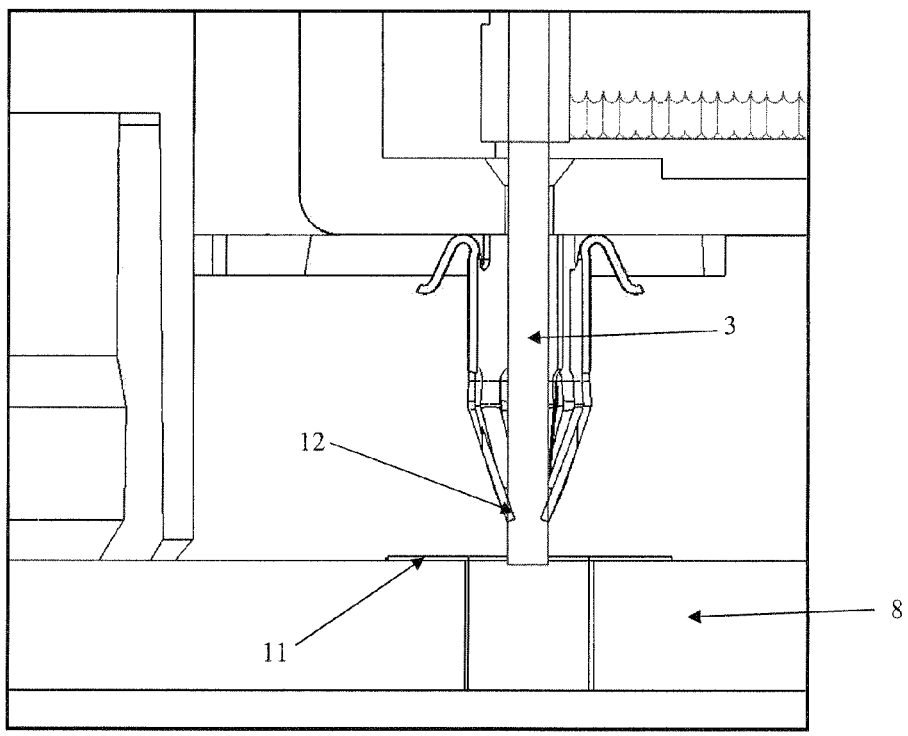
FIG. 18 is a cross-sectional view of a module according to the invention including contacts as shown in FIGS. 17a and 17b close to a printed circuit.

FIG. 18 shows this contact 2 fitted on an electric connection tab 3 in a cross-sectional view showing the contact 2 close to the printed circuit 8.

Figure 19:
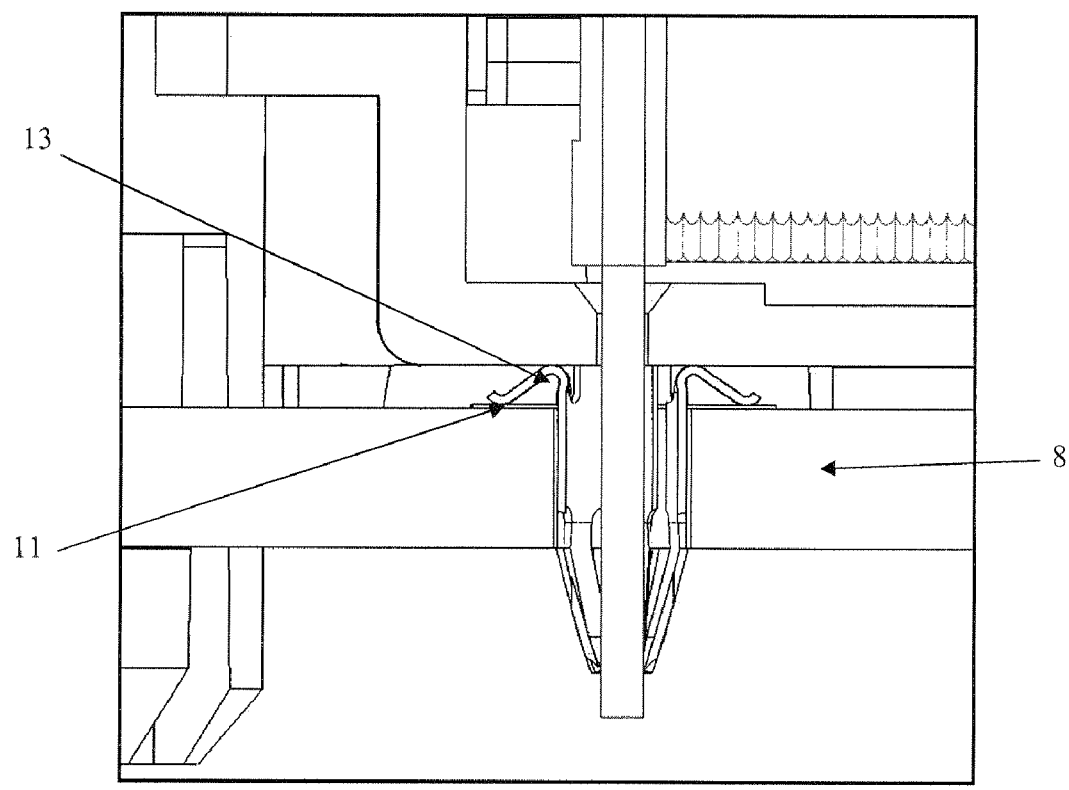
FIG. 19 is a cross-sectional view of a module according to the invention including contacts as shown in FIGS. 17a and 17b in contact with a printed circuit.

FIG. 19 shows the contact 2 mounted on the electrical connection tab 3 and positioned on the printed circuit 8. The geometry of contact 2 is such that it rests, through wings 13, on casing 7 on the upper part of the wings 13, and on the electrical contact area 11 of the lower part thereof.

An advantage of this contact 2 is that it can provide the electrical contact either through the contact of the wings 13 on the electrical contact areas 11 of the printed circuit 8 or through the connection of the contact body 2 inside the hole 10, which may be metalized. Therefore, contact 2 is appropriate for both printed circuits 8 with single faces and/or double faces.

Another advantage of this contact 2 of FIGS. 17a and 17b is that it is circular, which ensures that any effects caused by micro-vibrations in operation are mainly distributed in an axial direction and not a radial direction, thus making it possible for the contact 2 to perform reliably over time without causing oxidation.

The illustrations shown in this document are strictly exemplary and in no way represent limiting embodiments. Furthermore, one may modify the shape of the contact elements 2 or any other element mentioned in this document without departing from the scope of the invention.

The invention claimed is:

1. A dashboard indicator module comprising:
a motor substantially enclosed by a casing;
at least one electrical supply coil for supplying voltage to the motor;
at least one electrical connection tab linked to each of the at least one electrical supply coils, wherein the at least one electrical connection tab protrudes from the casing; and
at least one electrical contact element, wherein the at least one electrical contact element can be fitted on the at least one connection tab to produce at least one solderless connection to a printed circuit or removed from the at least one connection tab to allow the at least one connection tab to be soldered directly to the printed circuit.

2. The dashboard indicator module of claim 1, wherein each of the at least one electrical contact element has a first part in mechanical and electrical connection with the at least one connection tab and a second free part intended to come in mechanical and electrical contact with a voltage-supplied surface area of the printed circuit, which supports the dashboard indicator module and provides the motor with voltage.

3. The dashboard indicator module of claim 2, wherein the at least one electrical contact elements have spring-like mechanical properties.

4. The dashboard indicator module of claim 1, wherein the casing has at least one deformable rivet forming at least one protrusion and provides mechanical retention of the dashboard indicator module to the printed circuit.

5. The dashboard indicator module of claim 1, wherein the at least one electrical contact elements are deformed upon the positioning of the dashboard indicator module on said printed circuit.

6. The dashboard indicator module of claim 1, wherein the at least one electrical contact elements are mechanically fixed to one of the at least one electrical connection tab.

7. The dashboard indicator module of claim 1, wherein the at least one electrical contact elements are soldered to one of the at least one electrical connection tab.

8. The dashboard indicator module of claim 1, wherein the printed circuit has metallized holes and the at least one solderless connections are provided between the body of the at least one electrical contact element and the metallized holes of the printed circuit.

* * * * *